US006232361B1

(12) United States Patent
Laksin et al.

(10) Patent No.: US 6,232,361 B1
(45) Date of Patent: May 15, 2001

(54) RADIATION CURABLE WATER BASED CATIONIC INKS AND COATINGS

(75) Inventors: Mikhail Laksin, Scotch Plains; Jean Dominique Turgis, Rautherford; Bruce Rose, East Windsor; Subhankar Chatterjeee, Hampton, all of NJ (US)

(73) Assignee: Sun Chemical Corporation, Fort Lee, NJ (US)

( * ) Notice: Subject to any disclaimer, the term of this patent is extended or adjusted under 35 U.S.C. 154(b) by 0 days.

(21) Appl. No.: 09/209,227

(22) Filed: Dec. 11, 1998

(51) Int. Cl.$^7$ .............................. C08F 2/48; C09D 11/02; C09D 11/10; B32B 27/38
(52) U.S. Cl. ........................ 522/84; 522/170; 522/168; 522/100; 522/86; 522/81; 523/160; 106/31.6; 106/31.85; 106/31.28; 428/413; 428/500
(58) Field of Search .................................. 522/100, 168, 522/170, 84, 81, 75, 86, 182; 523/160; 106/31.28, 31.13, 31.6, 31.85; 428/413, 500

(56) References Cited

U.S. PATENT DOCUMENTS

| | | | |
|---|---|---|---|
| 4,080,274 | * 3/1978 | Schlesinger | 522/32 |
| 4,154,872 | * 5/1979 | Tsao et al. | 427/496 |
| 4,548,890 | 10/1985 | Dickinson et al. | 430/280 |
| 4,694,029 | 9/1987 | Land | 522/8 |
| 4,946,508 | 8/1990 | Schwartz et al. | 106/496 |
| 4,946,509 | 8/1990 | Schwartz et al. | 106/496 |
| 5,024,894 | 6/1991 | Chien | 428/433 |
| 5,062,894 | 11/1991 | Schwartz et al. | 106/23 |
| 5,093,386 | * 3/1992 | Bishop et al. | 522/96 |
| 5,370,971 | * 12/1994 | Ogawa et al. | 430/280.1 |
| 5,439,779 | 8/1995 | Day et al. | 430/280 |
| 5,463,084 | * 10/1995 | Crivello et al. | 549/214 |
| 5,623,001 | 4/1997 | Figov | 522/84 |
| 5,658,964 | * 8/1997 | Amon et al. | 522/31 |
| 5,674,922 | 10/1997 | Igarashi et al. | 522/168 |
| 5,721,020 | * 2/1998 | Takami et al. | 427/508 |

FOREIGN PATENT DOCUMENTS

| | | | |
|---|---|---|---|
| 196 47 848 A1 | 5/1997 | (DE) | C08G/65/22 |
| 0 071 345 A2 | 2/1983 | (EP) | C09D/11/00 |
| 2310211 | 8/1997 | (GB) | C08L/37/00 |
| 8-143806 | 8/1996 | (JP) | C09D/11/00 |
| WO 99/41296 | 8/1999 | (WO) | C08G/59/20 |

OTHER PUBLICATIONS

Formulating Concepts for Both High Solids and Water Based UV Curing Cycloaliphatic Epoxy Wood Coatings, Eaton, R.F., Hanrahan B.B., Braddock, J.K., pp. 384–401, as publised by the RadTech North America Proceedings, 1990 vol. 1.

Water Based Emulsions for Cyracure (R) Formulations, Union Carbide Chemicals and Plastics Company, Inc. Technical Bulletin No. 2, Mar. 14, 1990.

UV Curing of Epoxides, Watt, William, UV Curing vol. 2 Science & Technology, 1980, pp. 262–265 and 276–277.

Oxetanes: Curing Properties in Photointiated Cationic Polymerization and Application for Photocurable Materials, Sasaki H. and Kuriyama A., pp. 37–40, as published at the RadTech Asia '97, Yokohama, Japan Nov. 4–7, 1997.

Photoinitiators for Free Radical Initiated Photoimaging Systems, Monroe, B., Chem. Rev. '93, 1993, pp. 435–448.

Light Induced Polymerization of New Highly Reactive Acrylic Monomers, Moussa K., Decker C., Journal of Polymer Science Part A: Polymer Chemistry, vol. 31, pp. 2197–2203, Year Unavailable.

* cited by examiner

Primary Examiner—James J. Seidleck
Assistant Examiner—Sanza L McClendon
(74) Attorney, Agent, or Firm—Sidney Persley

(57) ABSTRACT

An actinic radiation curable, cationic polymerizable, ink and coating composition having greatly enhanced reactivity, and reduced viscosity and are low in odor comprised of an aqueous solution containing a cationic polymerizable compound such as an cycloaliphatic epoxy compound, a water compatible hydroxy functional cyclic ether compound, particularly, an epoxy or oxetane compound, and water.

25 Claims, 1 Drawing Sheet

RADIATION CURABLE WATER BASED CATIONIC INKS AND COATINGS

BACKGROUND OF THE INVENTION

1. Field of the Invention

This invention relates to ultraviolet (UV) or electron beam (EB) curable compositions. More particularly this invention relates to UV/EB curable cationic inks and coatings for use in ink jet, gravure and flexographic printing.

2. Description of Related Art

Cationic inks and coatings are well known for very good adhesion on different plastic and metallized substrates. Conventional cationic, ultraviolet or electron beam (hereinafter identified as UV/EB) curable inks and coatings typically are comprised of cycloaliphatic epoxy components which upon exposure to light of suitable wavelengths and in presence of suitable cationic photoinitiators, polymerizes to form a hard film with desired properties. One limitation of cycloaliphatic epoxides is their sensitivity to moisture which slows the cure rate. W. Watt reviewed the UV curing of epoxides in *The UV Curing of Epoxides, Chemistry & Technology of UV Curing*, Vol. 2, pp. 247–82, 1980. W. Watt notes in paragraph 5.4 that water will increase termination of cationic polymerization, and that high humidity has been shown to greatly increases the time for UV-curable epoxide coatings to become tack-free. In a more recent publication by R. F. Eaton et al. entitled *Formulating Concepts For Both High Solids And Water Based UV Cured Cycloaliphatic Epoxy Wood Coatings*, Rad. Tech. North America Proceedings, Vol. 1, pp. 384 et seq., 1990, they disclose that cycloaliphatic epoxies can be readily dispersed in water to form UV curable zero VOC emulsions which have coating performance equivalent to solvent applied cationic UV coatings. However, Eaton et al. also note that the rate of cure is significantly slowed by high humidity even though adding water to formulations does not slow cure.

Curable cationic coating compositions containing epoxy (i.e., oxirane) compounds and oxetane compounds are disclosed in Igarashi et al., U.S. Pat. No. 5,674,922; Takami et al., U.S. Pat. No. 5,721,020; and Kansai Paint Co., UK Patent Application GB 2310211. Igarashi et al. discloses active energy beam-curable compositions containing a compound with one oxetane ring and hydroxyl group in the molecule; a compound with one oxirane ring in the molecule; and a compound that initiates cationic polymerization. Igarashi's compositions are solvent free and viscosity is adjusted by varying the component ratios. Takami et al., discloses an ultraviolet-curing coating composition for cans which contains a cation-polymerizable compound, a compound having at least one oxetane ring in the molecule, a cationic initiator, and a lubricity imparting agent, i.e., a wax. Takami et al. also discloses that the coating composition can be applied by a variety of coating methods and that the resulting coating is heated to remove solvents if present. In the examples, solventless liquid compositions containing diepoxides and 3-ethyl-3-hydroxymethyloxetane were coated on a variety of substrates for testing. Kansai Paint Co. discloses an active energy ray-curable resin composition which contains a resin having an oxetane functional group as well as an epoxy group in the molecule; and a cationic polymerization initiator. Kansai Paint Co. discloses that their composition can be prepared by mixing the components in the presence of a solvent or a dispersing agent. Specific solvents disclosed are hydrocarbons, halogenated hydrocarbons; alcohols, ethers, ketones, and esters. Kansai Paint Co. further discloses that their formulation may further contain a monomeric oxetane such as 3-ethyl-3-hydroxymethyloxetane.

Although advances have been made in radiation curable cationic polymerization coating compositions, the curing of these coating compositions remains sensitive to humidity and require long cure times. In addition, viscosity adjustment of these compositions is frequently limited, particularly for solventless systems, thus limiting their use in applications such as low viscosity inks. Further, the coating components employed, particularly solvents, frequently emit vapors and/or odors which are undesirable for environmental or safety reasons. Accordingly, there is a need for materials used in fast curing cationic inks and coatings which are insensitive to humidity, have low viscosity, and use low odor diluents. These needs are met by the composition of the present invention.

SUMMARY OF THE INVENTION

The present invention is an actinic radiation curable, cationic polymerizable, compositions comprising an aqueous solution of: (a) a cationic polymerizable compound having at least two epoxy groups, oxetane groups, or a combination thereof; (b) a hydroxy alkyl cyclic ether selected from the group consisting of a hydroxyalkyl oxetane compound, a hydroxyalkyl epoxy compound, and a combination thereof; (c) water; and a cationic initiator which generates cations, e.g., protons, upon irradiation with ultraviolet radiation.

Another embodiment of the inventioin involves an aqueous solution of components (a), (b), (c); and a cationic initiator; having physical properties characterized by a three component phase diagram; wherein the vertices of said diagram represent 100 wt. % concentration of each component (a), (b) and (c); and wherein the binary concentrations of the cationic polymerizable compound and water are plotted along a first binary axis; the binary concentrations of the hydroxy alkyl cyclic ether and cationic polymerizable compound are plotted along a second binary axis; and the binary concentrations of the water and cyclic ether are plotted along a third binary axis; and wherein a cloud point curve within said diagram separates the single phase concentration region from the two-phase concentration region for the ternary mixture of components.

BRIEF DESCRIPTION OF THE DRAWINGS

The invention may be more fully understood from the following description and accompanying drawing, FIG. 1.

DETAILED DESCRIPTION OF THE INVENTION

Figure 1:
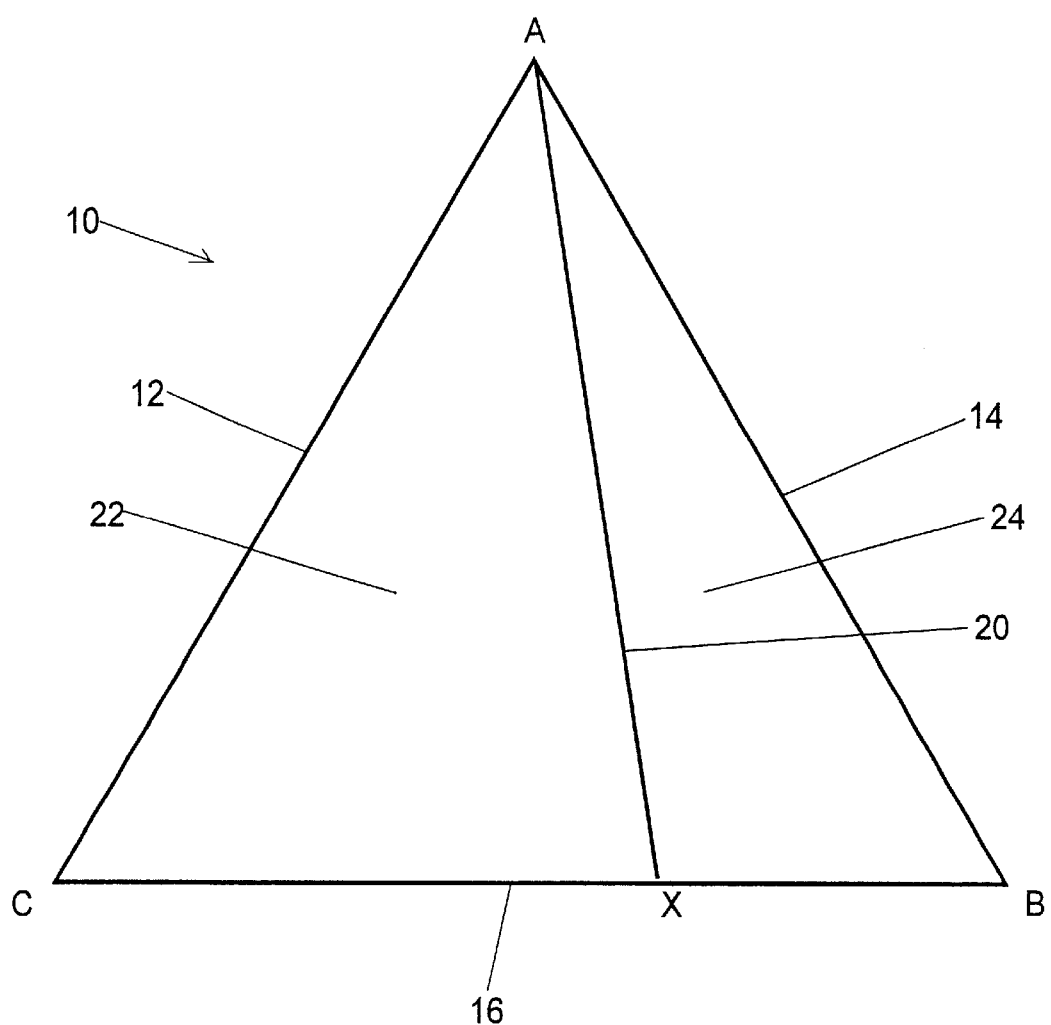
FIG. 1 is a three component phase diagram in which the components shown at the vertices are: (A) a cationic polymerizable compound, (B) a hydroxyalkyl cyclic ether, and (C) water.

The present invention is directed to novel cationically curable compositions having greatly enhanced reactivity, and reduced viscosity and odor. These improved properties are achieved by combining a cycloaliphatic epoxy with water compatible hydroxy functional cyclic ethers, particularly, epoxides or oxetanes, and water. In this invention water is used as a diluent to control viscosity and maintain low odor while hydroxy functional cyclic ether allows formulation of monophase mixtures, i.e., solutions, of these ingredients. Colorants can be incorporated into the cationic solutions of this invention to produce water-based inks with excellent rheology suitable for a wide range of printing applications from ink jet to higher viscosity paste inks. As used herein the term "solution" is intended to have its conventional meaning as a homogeneous mixture formed by dissolving one or more substances in another substance, i.e., a single phase liquid. The term "radiation curable" composition, as used herein, is intended to mean an composition which can be cured, hardened, polymerized, or crosslinked by the action of actinic radiation such as UV, EB, and the like from a radiant energy source. As used herein "actinic radiation" is intended to encompass radiation having a wavelength range from about 190 nm to about 400 nm, and preferably from about 240 nm to 400 nm. Actinic radiation of this type may be obtained from a variety of sources, e.g., mercury arc lamps, xenon arc lamps, fluorescent lamps, monochromatic laser sources, and the like. Actinic radiation as used herein also is intended to encompass high energy electrons such as from electric discharge devices or electron beam devices.

Radiation Curable Coating Composition:

The radiation curable, cationic polymerizable, composition of this invention is an aqueous solution of a cationic polymerizable compound having two or more epoxy groups, oxetane groups, or a combination thereof such as a cycloaliphatic diepoxy compound; a hydroxy alkyl cyclic ether, such as a hydroxyalkyl oxetane, a hydroxyalkyl epoxy, or a combination thereof; water; and a cationic initiator which generates cations upon irradiation with ultraviolet radiation. The cationic polymerizable, composition is characterized in that it is curable to a solid by exposure to energy from a radiant energy source as described supra. Curing of the aqueous solution (i.e. liquid vehicle) is initiated by activation of a polymerization initiating system (e.g., by UV radiation) as will be described in detail hereinbelow. The composition also may be cured to a solid by exposure to high energy electrons from an electron beam source.

Cationic Polymerizable Compound

The cationic polymerizable compound contains two or more cyclic ether reactive groups in which the groups are epoxy groups, oxetane groups, or a combination of epoxy and oxetane groups. The cationic polymerizable compound typically is a liquid oligomer or polymer containing the reactive groups. The term "oligomer" as used herein, is intended to mean a low molecular weight resin or polymer which contains two or more cyclic ether reactive groups which are capable of condensing upon cationic initiation to form a polymer with component moieties typically bound in sequence by ether linkages. The cationic polymerizable compound may be a solid, but typically it is a higher viscosity liquid. In each instance such cationic polymerizable compounds are soluble in the liquid hydroxy alkyl cyclic ether component. Preferably the cationic polymerizable compound is a cycloaliphatic diepoxide. Examples of cycloaliphatic diepoxides are copolymers of epoxides and hydroxyl components such as glycols, polyols, or vinyl ether, such as 3,4-epoxycyclohexylmethyl -3',4'-epoxycyclohexylcarboxylate; bis(3,4-epoxycylohexylmethyl) adipate; limonene diepoxide; diglycidyl ester of hexahydrophthalic acid; or a mixture thereof. A preferred cycloaliphatic epoxide of this type is 3,4-epoxycyclohexylmethyl -3',4'-epoxycyclohexylcarboxylate having the following formula.

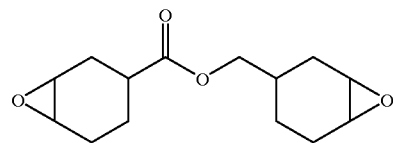

The cationic polymerizable compound may be a noncycloaliphatic epoxide, such as diglycidyl ether of bisphenol A; di- or triglycidyl ether of alkoxylated bisphenol A; novalac epoxy; and the like. The cationic polymerizable compounds containing two or more oxetane groups may also be used instead of, or in addition to the bis epoxy compounds described above. Suitable bis-oxetane compounds for use in this invention are described in Takami et al. U.S. Pat. No. 5,721,020, the disclosure of which is incorporated herein by reference. The cationic polymerizable compounds containing an epoxy (oxirane) group and an oxetane group, may also be used in the compositions of this invention. Suitable mixed functional compounds of this type which are useful in this invention are described in Toagosei Co. Offenlegungsschrift DE 196 47 848 A1. Compounds of this type include 3-((oxiranylmethoxy) methyl)- oxetane and 3-alkyl-3-((oxiranylmethoxy)-methyl)-oxetane wherein the alkyl group contains 1–8 carbon atoms. The epoxy functional compounds, the oxetane functional compounds and a mixture of these functional compounds may be used individually or may be used in combination as the cationic polymerizable compound in this invention.

Hydroxy Alkyl Cyclic Ether

The hydroxy alkyl cyclic ether functions as a reactive diluent for the cationic polymerizable compound. In addition, the hydroxy alkyl cyclic ether surprisingly has been found to reduce humidity sensitivity of curing, thus allowing shorter cure times for the coated compositions. Still further, the presence of the hydroxy alkyl cyclic ether forms a single phase solution with the mixture of the cationic polymerizable compound and water, thus providing the means to obtain low viscosity coating compositions with less odor. The hydroxy alkyl cyclic ether is a hydroxyalkyl oxetane, a hydroxyalkyl epoxy, or a combination of the two cyclic ether types. The alkyl group of the hydroxy alkyl cyclic ether contains 1 to 2 carbon atoms, with 1 carbon atom being preferred. The hydroxy alkyl cyclic ether may be further substituted with a second alkyl group having 1 to 6 carbon atoms. A preferred hydroxy alkyl cyclic ether is a hydroxyalkyl oxetane having the following structure:

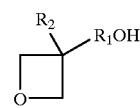

wherein $R_1$ is an alkenyl group having 1 to 2 carbon atoms, and $R_2$ is hydrogen or an alkyl group having 1 to 6 carbon atoms, with 2 carbon atoms being preferred. A particularly preferred oxetane of this type is 3-ethyl-3-hydroxymethyl-oxetane. Another preferred hydroxy alkyl cyclic ether is a hydroxyalkyl epoxy having the following structure:

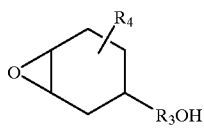

wherein $R_3$ is an alkenyl group having 1 to 2 carbon atoms, and $R_4$ is hydrogen or an alkyl group having 1 to 6 carbon atoms. A particularly preferred epoxy of this type is 4-hydroxymethyl-1,2-epoxycyclohexane.

Water

The third major ingredient of the compositions of this invention is water. Water, in suitable amounts, functions as an odor free diluent to adjust the viscosity of the resulting composition. In particular, water in combination with the hydroxyalkyl cyclic ether, in suitable proportions, forms a totally miscible solution which functions as a miscible diluent for the cationic polymerizable compound, resulting in a homogeneous aqueous solution. A key aspect of the present invention is that the viscosity of the coating composition may be altered by simply adjusting either the amount of water employed or the amount of the cationic polymerizable compound; provided that the resulting liquid remains an aqueous solution, i.e. single phase liquid.

The radiation curable, cationic polymerizable, composition of this invention may be more fully understood from the following description in connection with FIG. 1 of the accompanying drawing. FIG. 1 is a representation of a three component phase diagram (10) in which the major components are the cationic polymerizable compound, the hydroxyalkyl cyclic ether, and water. As used herein, the term "major component" is intended to mean a component having major concentration in the composition. In the phase diagram (10), the concentration of a mixture of the cationic polymerizable compound and water is plotted along a first binary axis (12) with vertice (A) representing 100 wt. % concentration of the cationic polymerizable compound; the concentration of a mixture of hydroxyalkyl cyclic ether and cationic polymerizable compound is plotted along a second binary axis (14) with vertice (B) representing 100 wt. % concentration of the hydroxyalkyl cyclic ether; and the concentration of a mixture of water and cyclic ether is plotted along a third binary axis (16) with vertice (C) representing 100 wt. % concentration of water. The point X on the third binary axis (16) defines the concentration at which phase transition occurs for the binary water/cyclic ether mixture from a two phase mixture (e.g. a dispersion) to a single phase (i.e. solution). The phase transition boundary (20), i.e., the cloud point curve, defines the ternary mixture concentrations (water, cyclic ether and cationic polymerizable compound) at which phase transition occurs from a two phase ternary mixture in concentration region (22) to a single phase ternary mixture in concentration region (24). The actinic radiation curable compositions of this invention, are represented by the ternary mixture of major components in concentration region (24). It is understood that the placement of the phase transition boundary (20) within the phase diagram (10), depends on the specific cationic polymerizable compound, and hydroxyalkyl cyclic ether employed in the ternary mixture, as well as other factors such as temperature. The temperatures at which the compositions are stored and used are typically about room temperature. Accordingly, stable solutions of the invention may be prepared under ambient conditions. While the major component concentration relationships for the compositions of this invention generally have been illustrated in FIG. 1, the preferred concentration of water (based on the combined weight of the major components) ranges from about 0.5 wt. % to about 45 wt. %. Combinations of the other components must further be within the concentration region (24) bound by the cloud point curve (20) and the second binary axis (14), i.e., the combination must form an aqueous solution.

Polymerization Initiating System

Unless the ink is formulated specifically for use with electron beam curing, the radiation curable compositions of this invention typically contain a cationic initiator which generates cations upon irradiation with actinic radiation, such as near ultraviolet radiation. Such a photoinitiator system has one or more compounds that directly furnish cations (protons) by the production of an acid when activated by actinic radiation. The photoinitiator system may also contain a sensitizer that extends spectral response into the near ultraviolet, visible and near infrared spectral regions.

Cationic polymerization photoinitiating systems typically are used to initiate condensation polymerization in systems such as the epoxy compositions described herein. Such cationic photoinitiating systems includes all substances which liberate Lewis acids or Broensted acids upon exposure to actinic radiation such as UV radiation. Cationic photoinitiating systems which are particularly useful in the radiation curable compositions of this invention are arylsulfonium salts, especially the triarylsulfonium salt such as triarylsulfonium phosphate, triarylsulfonium antimonate, triphenylsulfonium hexafluorophosphate, and diarylsulfonium salt; and aryl-iodonium salts, such as diaryliodonium hexafluoroantimonate, bisdodecylphenyliodonium hexafluoroantiminoate, and the like. Such cationic photoinitators may be used individually or in combination to effect suitable curing of the ink. Preferred as photoinitiators in the inks of this invention are diaryl-iodonium hexafluoroantimonate and $(\eta^5\text{-}2,4\text{-cyclopentadien-1-yl})[(1,2,3,4,5,6\text{-}\eta)(1\text{-methyl ethyl})\text{benzene}]\text{-iron}^+\text{-hexafluorophosphate}(-1)$. Typically, only small amounts of such photoinitiator systems are required to effectively initiate polymerization, e.g., from about 0.5 wt. % to about 5 wt. % (based on the total weight of the aqueous solution). Typically, the photoinitiator system is readily soluble in at least one of the major components of the solution.

Radiation Curable Ink

The aqueous, actinicradiation curable compositions of this invention may also contain, as an additional component, a quantity of a colorant in an amount sufficient to make an ink. As used herein, the term "ink" has its conventional meaning, i.e., a colored liquid composed of a colorant, typically a pigment, dispersed in liquid vehicle. In particular the radiation curable ink of this invention comprises a colorant, preferably a pigment, and the aqueous solution making up the actinic radiation curable, cationic polymerizable, composition fully described above.

Colorants

The actinic radiation curable compositions of this invention may contain one or more colorants such as dyes or pigments. When used as a radiation curable ink, the aqueous coating solution typically contains one or more pigments dispersed therein. The pigment or dye may be any conventional pigment or dye described in the prior art. Preferably an organic or inorganic pigment is employed such as Pigment Yellow 1, Pigment Yellow 3, Pigment Yellow 12, Pigment Yellow 13, Pigment Yellow 14, Pigment Yellow 17, Pigment Yellow 63, Pigment Yellow 65, Pigment Yellow 73, Pigment Yellow 74, Pigment Yellow 75, Pigment Yellow 83, Pigment Yellow 97, Pigment Yellow 98, Pigment Yellow 106, Pigment Yellow 114, Pigment Yellow 121, Pigment Yellow 126, Pigment Yellow 127, Pigment Yellow 136, Pigment Yellow 174, Pigment Yellow 176, Pigment Yellow 188, Pigment Orange 5, Pigment Orange 13, Pigment Orange 16, Pigment Orange 34, Pigment Red 2, Pigment Red 9, Pigment Red 14, Pigment Red 17, Pigment Red 22, Pigment Red 23, Pigment Red 37, Pigment Red 38, Pigment Red 41, Pigment Red 42, Pigment Red 112, Pigment Red 170, Pigment Red 210, Pigment Red 238, Pigment Blue 15, Pigment Blue 15:1, Pigment Blue 15:2, Pigment Blue 15:3, Pigment Blue 15:4, Pigment Green 7, Pigment Green 36, Pigment Violet 23, Pigment Black 7 and the like. Pigment compositions which are also useful in the energy curable inks of this invention are described in U.S. Pat. Nos. 4,946,508; 4,946,509; 5,024,894; and 5,062,894 each of which is incorporated herein by reference. Such pigment compositions are a blend of the pigment along with a poly(alkylene oxide) grafted pigment.

Adjuvants

Radiation curable coating and ink compositions prepared according to this invention may contain the usual adjuvants to adjust flow, surface tension and gloss of the cured coating or printed ink. Such adjuvants contained in inks or coatings typically are a surface active agent, a wax, or a combination thereof. These adjuvants may function as leveling agents, wetting agents, dispersants, defrothers or deareators, or additional adjuvants may be added to provide a specific function. Preferred adjuvants include fluorocarbon surfactants such as FC-430,a product of the 3M company; silicones, such as DC57, a product of Dow Chemical Corporation; polyethylene wax; polyamide wax; polytetrafluoroethylene wax; and the like.

Addition Polymerizable Component

In some instances, the radiation curable, cationic polymerizable, compositions may contain a free radical addition polymerizable composition. Typically, the radiation curable, cationic polymerizable, coating composition will contain less than 35 wt. % (based on the weight of the coating composition) of a free radical, addition polymerizable composition. The free radical addition polymerizable composition comprises a liquid compound having terminal ethylenic unsaturation. Typically, the free radical, addition polymerizable system comprises: an oligomer, a polymer or a combination thereof; an ethylenically unsaturated monomeric diluent; and a free radical photoinitiation system activated by actinic radiation. The monomeric diluent is a lower molecular weight ethylenically unsaturated compound which forms a polymer directly upon initiation by free radicals generated by absorbed radiation. Typically, the monomeric diluent is comprised of one or more monomeric compounds which have one, two or more terminal ethylenically unsaturated groups. Representative of such monomeric compounds are: methylmethacrylate; N-vinyl pyrolidone; dipropylene glycol diacrylate; tripropylene glycol diacrylate; butanediol diacrylate; hexanediol diacrylate; trimethyol propane triacrylate; ethoxylated trimethylol propane triacrylate; glycerolpropoxy triacrylate; pentaerythritrol triacrylate; dipropylene glycol dimethacrylate; tripropylene glycol dimethacrylate; butanediol dimethacrylate; hexanediol dimethacrylate; trimethyol propane trimethacrylate; and the like. The monomeric diluent may contain a combination of diacrylic and triacrylic monomers along with a monomer containing a single terminal ethylenic group. The inks of this invention may contain an oligomer having ethylenic unsaturation which can react with the ethylenically unsaturated reactive liquid diluent. Representative of such oligomers are acrylated epoxy resins; bis acrylic esters of bisphenol A; acrylated polyurethanes; acrylated polyesters; and the like. Preferred oligomers of this type include di-(3-methacryloxy-2-hydroxypropyl ether of bisphenol-A; di(2-methacryloxyethyl ether of bisphenol-A; di-(3-acryloxy-2-hydroxypropyl ether of bisphenol-A; di(2-acryloxyethyl ether of bisphenol-A; and the like. The inks of this invention may also contain a preformed polymer such as an acrylic polymer or copolymer of $C_1$–$C_4$ alkyl acrylates or methacrylates, or acrylic or methacrylic acid; vinyl polymers and copolymers such as polyvinyl chloride, polyvinyl acetate, polyvinyl alcohol; polyvinylpyrolidone; cellulosic polymers and copolymers; and the like.

In free radical initiated curing systems, typically irradiation of a photoinitiator produces free radicals that initiate polymerization. A wide variety of photoinitiators may be used in the supplementary "hybrid" compositions of this invention provided that the initiator is free of amine groups which would interfere with the concurrent cationic polymerization. Useful photoinitiators of this type are described in a review by B. M. Monroe and G. C. Weed entitled *"Photoinitiators for Free-Radical-Initiated Photoimaging Systems"*, Chem. Rev., 1993, No. 93, 435–48, which is incorporated herein by reference. Preferred photoinitiators which may be used alone or in combination with others are 4-(2-hydroxyethoxy)phenyl-(2-hydroxy-2-methylpropyl) ketone; isopropyl thioxanthone; and the like.

The curable compositions of this invention may be obtained by a variety of methods for applications that include protective, decorative and insulating coatings; potting compounds; sealants; adhesives; photoresists; textile coatings; and laminates on a variety of substrates, e.g., metal, rubber, plastic, wood, molded parts, films, paper, glass cloth, concrete, and ceramic. The curable compositions of this invention are particularly useful as inks for use in a variety of printing processes.

Aqueous, energy curable, ink and coating compositions prepared pursuant to this invention will now be illustrated by the following examples but are not intended to be limited thereby. In the following examples several coating and ink compositions using combination of a cycloaliphatic diepoxide, a hydroxy oxetane and water at different ratios were formulated and tested for rheology, cure, gloss and chemical resistance.

EXAMPLE 1

A UV flexo cationic yellow ink was prepared from the following components:

| Component | % by weight |
| --- | --- |
| Cyracure 6105[1] | 45 |
| Pigment Yellow 12 | 15 |
| EOXA[2] | 25 |
| Cyracure UVI 6990[3] | 5 |
| Water | 10 |
| Silicone Oil | 0.3 |

(1) Cyracure 6105 is 3,4-epoxycyclohexylmethyl-3',4'-epoxycyclohexylcarboxylate; a product of Union Carbide Chemicals and Plastics Technology Corporation;
(2) EOXA is 3-ethyl-3-hydroxymethyl-oxetane; and
(3) Cyracure UVI 6990 is a mixed triarylsulfonium hexafluorophosphate salts; a product of Union Carbide Chemicals and Plastics Technology Corporation.

This ink was prepared from a dispersion of Pigment Yellow 12 in Cyracure 6105. All other components were mixed into the pigment dispersion and the resulting ink was printed at 300 lines/inch (Ipi) using a gravure handproofer and cured with two 200 watt/inch (wpi) UV lamps at 200 feet/minute (fpm) belt speed. The ink had a density of 1.38; a gloss of 97 as determined on a BYK Glossmeter; and resisted 23 rubs with a cotton swab saturated with methyl ethyl ketone (MEK) immediately after post cure and 75 MEK rubs 24 hours after post cure.

EXAMPLE 2

A UV ink jet cationic blue ink was prepared from the following components:

| Component | % by weight |
| --- | --- |
| Cyracure 6105 | 11.9 |
| Pigment Blue 52-219 | 5.1 |
| EOXA | 55.06 |
| Cyracure 6974[4] | 5.0 |
| Water | 22.94 |

(4) Cyracure 6974 is a mixed triarylsulfonium hexafluoroantimonate salts; a product of Union Carbide Chemicals and Plastics Technology Corporation.

This ink was prepared from a dispersion of Pigment Blue 52-219 in Cyracure 6105. All other components were mixed into the pigment dispersion and the rheology of the resulting ink was measured. This ink had a viscosity of 13 cps at 25° C. when measured using a rotational rheometer and exhibited essentially Newtonian behavior over a wide range of shear rates, i.e., 100 sec$^{-1}$ to 2500 sec$^{-1}$. This ink was found suitable for ink jet printing.

EXAMPLE 3

A UV cationic coating composition was prepared from the following components:

| Component | % by weight |
| --- | --- |
| Cyracure 6105 | 45.41 |
| EOXA | 36.33 |
| Cyracure 6974 | 2.99 |
| Water | 15.17 |
| Silicone Oil | 0.30 |

The ingredients were mixed to give a clear solution and films prepared by applying the solution over a plastic substrate with a square bar applicator (about 6 mk film) and cured using two 200 wpi UV lamps at 100 fpm belt speed. The gloss of the cured coating was 80, and the coating resisted 5 MEK rubs immediately after cure and had essentially no odor.

EXAMPLE 4

A UV cationic coating composition was prepared from the following components:

| Component | % by weight |
| --- | --- |
| Cyracure 6105 | 45.0 |
| ETHB[5] | 36.0 |
| Cyracure 6974 | 3.0 |
| Water | 15.0 |
| Silicone Oil | 0.3 |

(5) ETHB is epoxidized tetrahydrobenzyl alcohol

The ingredients were mixed to give a clear solution and films prepared by applying the solution over a plastic substrate with a square bar applicator (about 6 mk film) and cured using two 200 wpi UV lamps at 150 fpm belt speed. The gloss of the cured coating was 81, and the coating resisted 20 MEK rubs immediately after cure.

EXAMPLE 5

A hybrid UV curable cationic/free radical coating composition was prepared from the following components:

| Component | % by weight |
| --- | --- |
| Cyracure 6105 | 25.0 |
| EOXA | 25.0 |
| Cyracure 6974 | 3.0 |
| Water | 15.0 |
| Laromer 8765[6] | 30.0 |
| Irgacure 2959[7] | 2.0 |

6. Laromer 8765 is epoxy acrylate; a product of BASF Corp.
7. Irgacure 2959 is 4-(2-hydroxyethoxy)phenyl-(2-hydroxy-2-methylpropyl)ketone; a product of Ciba Corp.

This coating composition was prepared, coated and cured as described in Example 3 except that this composition required 2 passes under one 300 wpi UV lamp at 150 fpm for complete the cure.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. An actinic radiation curable, cationic polymerizable, composition comprising an aqueous solution of:
   (a) a cationic polymerizable compound having two or more epoxy groups, oxetane groups, or a combination thereof;
   (b) a hydroxy alkyl cyclic ether selected from the group consisting of a hydroxyalkyl oxetane compound, a hydroxyalkyl epoxy compound, and a combination thereof;
   (c) water; and
   (d) a cationic initiator.

2. The composition of claim 1 wherein the cationic polymerizable compound is a cycloaliphatic epoxy compound.

3. The composition of claim 2 wherein the cycloaliphatic epoxy compound is 3,4-epoxycyclohexylmethyl -3',4'-epoxycyclohexylcarboxylate.

4. The composition of claim 1 wherein the cationic polymerizable compound is selected from the group consisting of a diglycidyl ether of bisphenol A; diglycidyl ether of alkoxylated bisphenol A; a triglycidyl ether of alkoxylated bisphenol A; novalac epoxy; and combinations thereof.

5. The composition of claim 1 wherein the hydroxy alkyl cyclic ether is the hydroxyalkyl oxetane.

6. The composition of claim 5 wherein the hydroxyalkyl oxetane has the structure:

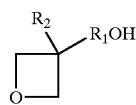

wherein $R_1$ is an alkenyl group having 1 to 2 carbon atoms, and $R_2$ is hydrogen or an alkyl group having 1 to 6 carbon atoms.

7. The composition of claim 6 wherein the hydroxyalkyl oxetane is 3-ethyl-3-hydroxymethyl-oxetane.

8. The composition of claim 1 wherein the hydroxy alkyl cyclic ether is the hydroxyalkyl epoxy compound.

9. The composition of claim 8 wherein the hydroxyalkyl epoxy compound has the structure:

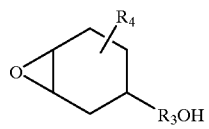

wherein $R_3$ is an alkenyl group having 1 to 2 carbon atoms, and $R_4$ is hydrogen or an alkyl group having 1 to 6 carbon atoms.

10. The composition of claim 9 wherein the hydroxyalkyl epoxy compound is 4-hydroxymethyl-1,2-epoxycyclohexane.

11. The composition of claim 1 wherein the hydroxy alkyl cyclic ether is the combination of the hydroxyalkyl oxetane and the hydroxyalkyl epoxy.

12. The composition of claim 11 wherein the hydroxyalkyl oxetane is 3-ethyl-3-hydroxymethyl-oxetane and the hydroxyalkyl epoxy is 4-hydroxymethyl-1,2-epoxycyclohexane.

13. The composition of claim 1 wherein the actinic radiation is ultraviolet radiation.

14. The composition of claim 1 wherein the actinic radiation is an electron beam.

15. The composition of claim 1 wherein the coating composition further comprises a colorant.

16. The composition of claim 15 wherein the colorant is a dye.

17. The composition of claim 15 wherein the colorant is a pigment dispersed in the aqueous solution.

18. The composition of claim 1 wherein the coating composition further comprises a vinyl ether.

19. The composition of claim 1 further comprising less than 35 wt. % based on the weight of the coating composition of a free radical, addition polymerizable composition.

20. The composition of claim 19 wherein the free radical, addition polymerizable composition comprises:
   (1) an oligomer, a polymer or a combination thereof,
   (2) an ethylenically unsaturated monomeric diluent; and
   (3) a free radical photoinitiation system activated by the actinic radiation.

21. An actinic radiation curable, cationic polymerizable, composition comprised of
   an aqueous solution of components: (a) a cationic polymerizable compound having two or more epoxy groups, oxetane groups, or a combination thereof; (b) a hydroxy alkyl cyclic ether selected from the group consisting of a hydroxyalkyl oxetane compound, a hydroxyalkyl epoxy compound, and a combination thereof; (c) water; and (d) a cationic initiator; having physical properties characterized by a three component phase diagram; wherein the vertices of said diagram represent 100 wt. % concentration of each component (a), (b) and (c); and wherein the binary concentrations of the cationic polymerizable compound and water are plotted along a first binary axis; the binary concentrations of the hydroxy alkyl cyclic ether and cationic polymerizable compound are plotted along a second binary axis; and the binary concentrations of the water and cyclic ether are plotted along a third binary axis; and wherein a cloud point curve within said diagram separates the single phase concentration region from the two-phase concentration region for the ternary mixture of components (a), (b) and (c).

22. The composition of claim 21 wherein the single phase region is bound by the cloud point curve and the second binary axis.

23. The composition of claim 22 represented by a region bound by the cloud point curve, second binary axis and a portion of the third binary axis wherein the water concentration ranges from 0 to 45 wt. %.

24. A printing ink prepared from the actinic radiation curable, cationic polymerizable, composition of claim 21.

25. A coating prepared from the actinic radiation curable, cationic polymerizable, composition of claim 21.

* * * * *